(12) United States Patent
Zhang et al.

(10) Patent No.: US 11,424,141 B2
(45) Date of Patent: Aug. 23, 2022

(54) SUBSTRATE PROCESSING APPARATUS, SUBSTRATE PROCESSING METHOD AND RECORDING MEDIUM

(71) Applicant: Tokyo Electron Limited, Tokyo (JP)

(72) Inventors: Jian Zhang, Koshi (JP); Takao Inada, Koshi (JP); Hisashi Kawano, Koshi (JP); Seigo Fujitsu, Koshi (JP); Hideaki Sato, Koshi (JP); Teruaki Konishi, Koshi (JP); Toshiyuki Shiokawa, Koshi (JP); Koji Ogura, Koshi (JP); Hiroshi Yoshida, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/165,118

(22) Filed: Oct. 19, 2018

(65) Prior Publication Data
US 2019/0122906 A1  Apr. 25, 2019

(30) Foreign Application Priority Data

Oct. 20, 2017 (JP) .............................. JP2017-203800
Sep. 27, 2018 (JP) .............................. JP2018-181792

(51) Int. Cl.
*H01L 21/67* (2006.01)
*H01L 21/306* (2006.01)
*H01L 21/311* (2006.01)

(52) U.S. Cl.
CPC .. *H01L 21/67086* (2013.01); *H01L 21/30604* (2013.01); *H01L 21/31111* (2013.01); *H01L 21/67017* (2013.01); *H01L 21/67173* (2013.01)

(58) Field of Classification Search
None
See application file for complete search history.

(56) References Cited

U.S. PATENT DOCUMENTS

| | | | | |
|---|---|---|---|---|
| 5,845,660 A | * | 12/1998 | Shindo | .............. H01L 21/67028 134/56 R |
| 5,922,138 A | * | 7/1999 | Shindo | .................... B08B 9/027 134/2 |
| 6,589,338 B1 | * | 7/2003 | Nakamori | ......... H01L 21/67051 118/50 |

(Continued)

FOREIGN PATENT DOCUMENTS

JP  H09-275091 A  10/1997
JP  2009-206419 A  9/2009

(Continued)

*Primary Examiner* — Sylvia MacArthur
(74) *Attorney, Agent, or Firm* — Pearne & Gordon LLP

(57) ABSTRACT

A substrate processing apparatus, a substrate processing method and a recording medium capable of shortening an etching processing time are provided. The substrate processing apparatus includes a substrate processing tub, a mixing unit and a supply line. The substrate processing tub is configured to perform an etching processing therein with an etching liquid. The mixing unit is configured to mix a new liquid with a silicon-containing compound or a liquid containing the silicon-containing compound. The supply line is configured to supply a mixed solution mixed by the mixing unit into the substrate processing tub.

5 Claims, 10 Drawing Sheets

(56) References Cited

U.S. PATENT DOCUMENTS

| | | | |
|---|---|---|---|
| 8,216,417 B2* | 7/2012 | Fujiwara | H01L 21/67057 134/135 |
| 8,597,461 B2* | 12/2013 | Mayer | H01L 21/67017 156/345.21 |
| 9,230,836 B2* | 1/2016 | Higuchi | H01L 21/67051 |
| 2001/0011548 A1* | 8/2001 | Tanaka | B08B 3/102 134/18 |
| 2011/0290279 A1* | 12/2011 | Hyakutake | H01L 21/67109 134/18 |
| 2013/0220478 A1* | 8/2013 | Kasahara | H01L 21/67017 141/2 |
| 2015/0093906 A1* | 4/2015 | Kobayashi | H01L 21/31111 438/748 |
| 2019/0096711 A1* | 3/2019 | Ohno | H01L 21/67086 |
| 2019/0122906 A1* | 4/2019 | Zhang | H01L 21/67086 |

FOREIGN PATENT DOCUMENTS

| | | |
|---|---|---|
| JP | 2015-056631 A | 3/2015 |
| JP | 2015-088603 A | 5/2015 |
| JP | 2015-135943 A | 7/2015 |
| JP | 2016-032030 A | 3/2016 |
| WO | 2017/057727 A1 | 4/2017 |

* cited by examiner

SUBSTRATE PROCESSING APPARATUS, SUBSTRATE PROCESSING METHOD AND RECORDING MEDIUM

CROSS-REFERENCE TO RELATED APPLICATION

This application claims the benefit of Japanese Patent Application Nos. 2017-203800 and 2018-181792 filed on Oct. 20, 2017 and Sep. 27, 2018, respectively, the entire disclosures of which are incorporated herein by reference.

TECHNICAL FIELD

The various aspects and embodiments described herein pertain generally to a substrate processing apparatus, a substrate processing method and a recording medium.

BACKGROUND

Conventionally, in a substrate processing apparatus, it is known that a dummy lot is immersed in a substrate processing tub to increase a silicon concentration of an etching liquid when replacing the etching liquid (see Patent Document 1).

Patent Document 1: Japanese Patent Laid-open Publication No. 2015-056631

In the aforementioned substrate processing apparatus, however, the dummy lot is transferred and immersed in the etching liquid, and, then, the dummy lot is taken out and transferred back. For this reason, a time taken to increase the silicon concentration of the etching liquid is lengthened. That is, an etching processing time is increased.

SUMMARY

In view of the foregoing, exemplary embodiments provide a substrate processing apparatus, a substrate processing method and a recording medium capable of shortening an etching processing time.

In one exemplary embodiment, a substrate processing apparatus includes a substrate processing tub, a mixing unit and a supply line. The substrate processing tub is configured to perform an etching processing therein with an etching liquid. The mixing unit is configured to mix a new liquid with a silicon-containing compound or a liquid containing the silicon-containing compound. The supply line is configured to supply a mixed solution mixed by the mixing unit into the substrate processing tub.

According to the exemplary embodiments, it is possible to shorten an etching processing time.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
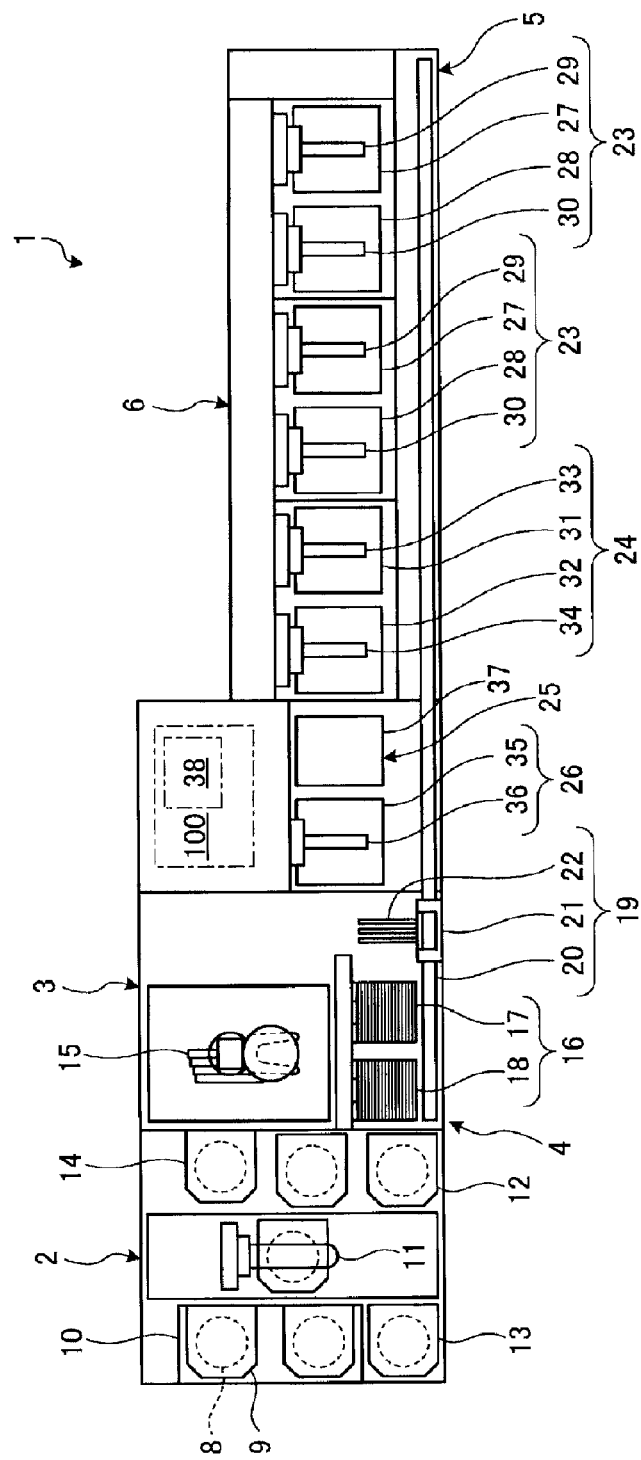
FIG. 1 is a schematic plan view of a substrate processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate processing apparatus, a substrate processing method and a recording medium according to exemplary embodiments will be describe in detail with reference to accompanying drawings. Here, however, it should be noted that the exemplary embodiments are not limiting.

First Exemplary Embodiment

As depicted in FIG. 1, a substrate processing apparatus 1 according to a first exemplary embodiment includes a carrier carry-in/out unit 2, a lot forming unit 3, a lot placing unit 4, a lot transferring unit 5, a lot processing unit 6 and a control unit 100. FIG. 1 is a schematic plan view of the substrate processing apparatus 1. Here, a direction orthogonal to a horizontal direction will be defined as a vertical direction.

The carrier carry-in/out unit 2 is configured to perform a carry-in and a carry-out of a carrier 9 in which a plurality (e.g., 25 sheets) of substrates (silicon wafers) 8 are vertically arranged in a horizontal posture.

The carrier carry-in/out unit 2 is equipped with a carrier stage 10 configured to place multiple carriers 9 thereon; a carrier transfer device 11 configured to transfer the carrier 9; carrier stocks 12 and 13 configured to place therein the carrier 9 temporarily; and a carrier placing table 14 configured to place the carrier 9 thereon.

The carrier carry-in/out unit 2 transfers the carrier 9, which is carried onto the carrier stage 10 from the outside, to the carrier stock 12 or the carrier placing table 14 by using the carrier transfer device 11. That is, the carrier carry-in/out unit 2 transfers the carrier 9 accommodating therein the plurality of substrates 8 before being processed by the lot processing unit 6 to the carrier stock 12 or the carrier placing table 14.

The carrier stock 12 temporarily places therein the carrier 9 which accommodates therein the plurality of substrates 8 before being processed by the lot processing unit 6.

The plurality of substrates 8 are carried out from the carrier 9, which is carried onto the carrier placing table 14 while accommodating therein the plurality of substrates 8 before being processed by the lot processing unit 6, by a substrate transfer device 15 to be described later.

Further, the plurality of substrates 8 after being processed by the lot processing unit 6 is carried from the substrate transfer device 15 into the carrier 9 which is placed on the carrier placing table 14 and does not accommodate the substrates 8 therein.

The carrier carry-in/out unit 2 carries the carrier 9, which is placed on the carrier placing table 14 and accommodates therein the plurality of substrates 8 after being processed by the lot processing unit 6, to the carrier stock 13 or the carrier stage 10 by using the carrier transfer device 11.

The carrier stock 13 temporarily accommodates therein the plurality of substrates 8 after being processed by the lot processing unit 6. The carrier 9 transferred to the carrier stage 10 is carried to the outside.

The lot forming unit 3 is equipped with the substrate transfer device 15 configured to transfer a plurality (e.g., 25 sheets) of substrates 8. The lot forming unit 3 performs a transfer of the plurality (e.g., 25 sheets) of substrates 8 by the substrate transfer device 15 twice and forms a lot composed of a multiplicity (e.g., 50 sheets) of substrates 8.

The lot forming unit 3 forms the lot by transferring the multiplicity of substrates 8 from the carriers 9 placed on the carrier placing table 14 to the lot placing unit 4 by using the carrier transfer device 15 and placing the multiplicity of substrates 8 on the lot placing unit 4.

The multiplicity of substrates 8 belonging to the single lot are processed by the lot processing unit 6 at the same time. When forming the lot, the substrates 8 may be arranged such that surfaces thereof having patterns formed thereon face each other or such that the surfaces thereof having the patterns formed thereon all face to one direction.

Further, in the lot forming unit 3, the multiplicity of substrates 8 are transferred by the substrate transfer device 15 to the carrier 9 from the lot placed in the lot placing unit 4 after being subjected to the processing in the lot processing unit 6.

The substrate transfer device 15 is equipped with, as a substrate supporting unit configured to support the multiplicity of substrates 8, two types of substrate supporting unit: a before-processed substrate supporting unit (not shown) configured to support the substrates 8 before being subjected to a processing; and an after-processed substrate supporting unit (not shown) configured to support the processed substrates 8. Accordingly, particles or the like adhering to the substrates 8 before being processed may be suppressed from adhering to the substrates 8 after being processed.

The substrate transfer device 15 changes a posture of the substrates 8 from a horizontal posture to a vertical posture and from the vertical posture to the horizontal posture while transferring the substrates 8.

In the lot placing unit 4, the lot which is transferred between the lot forming unit 3 and the lot processing unit 6 by the lot transferring unit 5 is temporarily placed (stands by) on the lot placing table 16.

The lot placing unit 4 is equipped with a carry-in side lot placing table 17 and a carry-out side lot placing table 18.

The carry-in side lot placing table 17 is configured to place thereon the lot before being processed. The carry-out side lot placing table 18 is configured to place thereon the lot after being processed.

On each of the carry-in side lot placing table 17 and the carry-out side lot placing table 18, the multiplicity of substrates 8 corresponding to the single lot are arranged in a forward-backward direction with the vertical posture.

The lot transferring unit 5 is configured to transfer the lot between the lot placing unit 4 and the lot processing unit 6 and within the lot processing unit 6.

The lot transferring unit 5 is equipped with the lot transfer device 19 configured to transfer the lot. The lot transfer device 19 includes a rail 20 extended along the lot placing unit 4 and the lot processing unit 6; and a moving body 21 configured to be moved along the rail 20 while holding the lot.

The moving body 21 is provided with a substrate holding body 22 configured to hold the multiplicity of substrates 8 arranged in the forward-backward direction with the vertical posture.

The lot transferring unit 5 receives the lot placed on the carry-in side lot placing table 17 with the substrate holding body 22 of the lot transfer device 19 and delivers the received lot to the lot processing unit 6.

Further, the lot transferring unit 5 receives the lot processed by the lot processing unit 6 with the substrate holding body 22 of the lot transfer device 19 and delivers the received lot to the carry-out side lot placing table 18.

Further, the lot transferring unit 5 also performs the transfer of the lot within the lot processing unit 6 by using the lot transfer device 19.

The lot processing unit 6 is configured to perform a processing such as etching, cleaning and drying on the single lot composed of the multiplicity of substrates 8 arranged in the forward-backward direction with the vertical posture.

The lot processing unit 6 includes two etching apparatuses 23 configured to perform an etching processing on the lot; a cleaning apparatus 24 configured to perform a cleaning processing on the lot; a substrate holding body cleaning apparatus 25 configured to perform a cleaning processing on the substrate holding body 22; and a drying apparatus 26 configured to perform a drying processing on the lot. Further, the number of the etching apparatuses 23 is not limited to 2 and may be one or more than 2.

Each etching apparatus 23 includes a processing tub 27 for etching, a processing tub 28 for rinsing, and substrate elevating devices 29 and 30.

The processing tub 27 for etching stores therein a processing liquid for etching (hereinafter, referred to as "etching liquid"). The processing tub 28 for rinsing stores therein a processing liquid for rinsing (pure water or the like). Details of the processing tub 27 for etching will be described later.

The multiple number of substrates 8 constituting the single lot are held by the substrate elevating device 29 (30) while being arranged in the forward-backward direction with the vertical posture.

The etching apparatus 23 receives the lot from the substrate holding body 22 of the lot transfer device 19 with the substrate elevating device 29, and the received lot is moved up and down by the substrate elevating device 29. Accordingly, the lot is immersed in the etching liquid in the processing tub 27, so that an etching processing is performed.

Thereafter, the etching apparatus 23 takes out the lot from the processing tub 27 by raising the substrate elevating device 29, and delivers the lot to the substrate holding body 22 of the lot transfer device 19 from the substrate elevating device 29.

Then, the lot is received by the substrate elevating device 30 from the substrate holding body 22 of the lot transfer device 19, and the received lot is moved up and down by the substrate elevating device 30. Accordingly, the lot is immersed in the processing liquid for rinsing in the processing tub 28, so that a rinsing processing is performed.

Thereafter, the etching apparatus 23 takes out the lot from the processing tub 28 by raising the substrate elevating device 30, and delivers the lot to the substrate holding body 22 of the lot transfer device 19 from the substrate elevating device 30.

The cleaning apparatus 24 is equipped with a processing tub 31 for cleaning, a processing tub 32 for rinsing, and substrate elevating devices 33 and 34.

The processing tub 31 for cleaning stores therein a processing liquid for cleaning (SC-1 or the like). The processing tub 32 for rinsing stores therein a processing liquid for rinsing (pure water or the like). The multiplicity of substrates 8 belonging to the single lot are held by each of the substrate elevating devices 33 and 34 while being arranged in the forward-backward direction with the vertical posture.

The drying apparatus 26 is equipped with a processing tub 35 and a substrate elevating device 36 configured to be moved up and down with respect to the processing tub 35.

A processing gas for drying (IPA (isopropyl alcohol)) is supplied into the processing tub 35. The multiplicity of substrates 8 corresponding to the single lot are held by the substrate elevating device 36 while being arranged in the forward-backward direction with the vertical posture.

The drying apparatus 26 receives the lot from the substrate holding body 22 of the lot transfer device 19 with the substrate elevating device 36, and carries the received lot into the processing tub 35 by moving the received lot up and down with the substrate elevating device 36. Then, a drying processing is performed on the lot by the processing gas for drying supplied into the processing tub 35. Thereafter, the drying apparatus 26 raises the lot with the substrate elevating device 36 and delivers the lot after being subject to the drying processing to the substrate holding body 22 of the lot transfer device 19 from the subtract elevating device 36.

The substrate holding body cleaning apparatus 25 includes a processing tub 37 and is configured to supply a processing liquid for cleaning and a drying gas into this processing tub 37. By supplying the drying gas after supplying the processing liquid for cleaning to the substrate holding body 22 of the lot transfer device 19, the substrate holding body cleaning apparatus 25 performs a cleaning processing on the substrate holding body 22.

The control unit 100 controls operations of individual components (the carrier carry-in/out unit 2, the lot forming unit 3, the lot placing unit 4, the lot transferring unit 5, and the lot processing unit 6) of the substrate processing apparatus 1. The control unit 100 controls the operations of the individual components of the substrate processing apparatus 1 based on signals from switches or the like.

The control unit 100 may be implemented by, for example, a computer and has a computer-readable recording medium 38. The recording medium 38 stores therein programs for controlling various types of processings performed in the substrate processing apparatus 1.

The control unit 100 controls the operation of the substrate processing apparatus 1 by reading and executing the programs stored in the recording medium 38. Further, the programs are stored in the compute-readable recording medium 38 and may be installed to the recording medium 38 of the control unit 100 from another recording medium.

The computer-readable recording medium 38 may be implemented by, by way of non-limiting example, a hard disk HD, a flexible disk FD, a compact disk CD, a magnet optical disk MO, a memory card, or the like.

Figure 2:
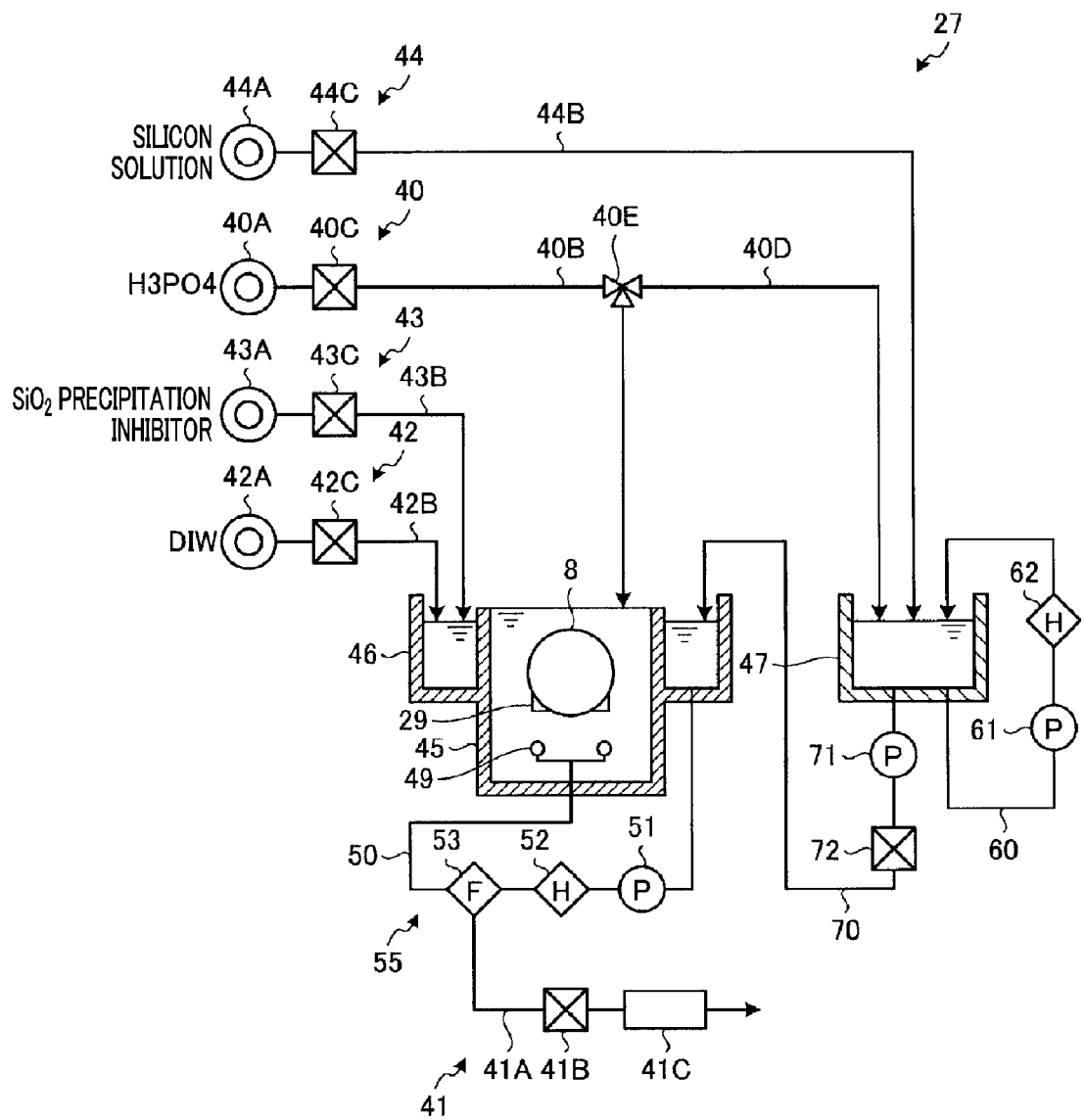
FIG. 2 is a schematic block diagram illustrating a configuration of a processing tub for etching according to a first exemplary embodiment.

Now, the processing tub 27 for etching will be explained with reference to FIG. 2. FIG. 2 is a schematic block diagram illustrating a configuration of the processing tub 27 for etching according to the first exemplary embodiment.

In the processing tub 27 for etching, between a nitride film (SiN) and an oxide film ($SiO_2$) formed on the substrate 8, only the nitride film is selectively etched by using an etching liquid.

In the etching processing for the nitride film, a solution, prepared by adding a silicon (Si)-containing compound to a phosphoric acid ($H_3PO_4$) aqueous solution, with an adjusted silicon concentration is generally used as the etching liquid. As a way to adjust the silicon concentration, a method of dissolving silicon by immersing a dummy substrate in a phosphoric acid aqueous solution (seasoning), a method of dissolving a silicon-containing compound such as colloidal silica in the phosphoric acid aqueous solution, or the like may be used. Further, there is also employed a method of adjusting the silicon concentration by adding a silicon-containing compound aqueous solution to the phosphoric acid aqueous solution.

In the etching processing, by increasing the silicon concentration of the etching liquid, selectivity for etching only the nitride film can be improved. If, however, the silicon concentration of the etching liquid is increased excessively as the nitride film is dissolved in the etching liquid through the etching processing, the silicon dissolved in the etching liquid may be precipitated on the oxide film as a silicon oxide.

In the present exemplary embodiment, to suppress the precipitation of the silicon oxide, the etching processing is performed by using an etching liquid prepared by mixing a $SiO_2$ precipitation inhibitor into a phosphoric acid aqueous solution in which a silicon solution is dissolved.

By way of non-limiting example, the silicon-containing compound may be colloidal silica. Besides the colloidal silica, the silicon-containing compound may be a different type of silica such as fumed silica.

Alternatively, the silicon-containing compound may be alkoxysilane (tetramethoxysilane, tetraethoxysilane, etc.), silazane (hexamethylsilazane, 1, 1, 1, 3, 3, 3-hexamethylpropanedisilazane, etc.), siloxane (1, 1, 3, 3-tetramethyldisiloxane, hexamethyldisiloxane, etc.), silanol (triethylsilanol, trimethylsilanol, etc.), silicic acid (orthosilicic acid, metasilicic acid, etc.), or the like.

The $SiO_2$ precipitation inhibitor may be implemented by, by way of non-limiting example, ammonium hexafluorosilicate (($NH_4$)$_2$$SiF_6$), sodium hexafluorosilicate ($Na_2SiF_6$), or the like.

The processing tub 27 for etching is equipped with a phosphoric acid aqueous solution supply unit 40, a phosphoric acid aqueous solution drain unit 41, a pure water supply unit 42, a $SiO_2$ precipitation inhibitor supply unit 43, a silicon supply unit 44, an inner tub 45, an outer tub 46 and a temperature control tank 47. The inner tub 45 and the outer tub 46 constitute a substrate processing tub.

The phosphoric acid aqueous solution supply unit 40 includes a phosphoric acid aqueous solution source 40A, a phosphoric acid aqueous solution supply line 40B and a first flow rate controller 40C.

The phosphoric acid aqueous solution source 40A is a tank configured to store the phosphoric acid aqueous solution therein. The phosphoric acid aqueous solution supply line 40B is configured to connect the phosphoric acid aqueous solution source 40A and the inner tub 45 and configured to supply the phosphoric acid aqueous solution from the phosphoric acid aqueous solution source 40A to the inner tub 45.

The phosphoric acid aqueous solution supply line 40B has a branch line 40D, and is configured to connect the phosphoric acid aqueous solution source 40A and the temperature control tank 47 via the branch line 40D. Further, the phosphoric acid aqueous solution supply line 40B is configured to supply the phosphoric acid aqueous solution from the phosphoric acid aqueous solution source 40A into the temperature control tank 47.

The branch line 40D is connected to the phosphoric acid aqueous solution supply line 40B via, by way of non-limiting example, a three-way valve 40E. The three-way valve 40E switches a supply destination of the phosphoric acid aqueous solution to either the inner tub 45 or the temperature control tank 47.

The first flow rate controller 40C is provided at the phosphoric acid aqueous solution supply line 40B closer to the phosphoric acid aqueous solution source 40A than the three-way valve 40E is, and is configured to adjust a flow rate of the phosphoric acid aqueous solution supplied into the inner tub 45 or the temperature control tank 47. The first flow rate controller 40C is composed of an opening/closing valve, a flow rate control valve, a flowmeter, and the like. Further, the phosphoric acid aqueous solution supply unit 40 may be configured to supply the phosphoric acid aqueous solution into the outer tub 46.

The pure water supply unit 42 includes a pure water source 42A, a pure water supply line 42B, and a second flow rate controller 42C. The pure water supply unit 42 is configured to supply pure water (DIW) into the outer tub 46 to replenish moisture that has evaporated as the etching liquid is heated.

The pure water supply line 42B is configured to connect the pure water source 42A and the outer tub 46 and configured to supply the pure water of a preset temperature from the pure water source 42A into the outer tub 46.

The second flow rate controller 42C is provided at the pure water supply line 42B and configured to adjust a flow rate of the pure water supplied to the outer tub 46. The second flow rate controller 42C is composed of an opening/closing valve, a flow rate control valve, a flowmeter, and so forth.

The $SiO_2$ precipitation inhibitor supply unit 43 includes a $SiO_2$ precipitation inhibitor source 43A, a $SiO_2$ precipitation inhibitor supply line 43B, and a third flow rate controller 43C. The $SiO_2$ precipitation inhibitor supply unit 43 is configured to supply the $SiO_2$ precipitation inhibitor into the outer tub 46 when performing the etching processing. Further, the $SiO_2$ precipitation inhibitor supply unit 43 is configured to supply the $SiO_2$ precipitation inhibitor into the outer tub 46 to replenish the $SiO_2$ precipitation inhibitor that has evaporated as the etching liquid is heated.

The $SiO_2$ precipitation inhibitor source 43A is a tank which stores the $SiO_2$ precipitation inhibitor therein. The $SiO_2$ precipitation inhibitor supply line 43B is configured to connect the $SiO_2$ precipitation inhibitor source 43A and the outer tub 46 and configured to supply the $SiO_2$ precipitation inhibitor from the $SiO_2$ precipitation inhibitor source 43A into the outer tub 46.

The third flow rate controller 43C is provided at the $SiO_2$ precipitation inhibitor supply line 43B and configured to adjust a flow rate of the $SiO_2$ precipitation inhibitor supplied to the outer tub 46. The third flow rate controller 43C is composed of an opening/closing valve, a flow rate control valve, a flowmeter, and so forth.

The silicon supply unit 44 includes a silicon source 44A, a silicon supply line 44B and a fourth flow rate controller 44C.

The silicon source 44A is a tank which stores the silicon solution. The silicon supply line 44B is configured to connect the silicon source 44A and the temperature control tank 47 and configured to supply the silicon solution from the silicon source 44A into the temperature control tank 47.

The fourth flow rate controller 44C is provided at the silicon supply line 44B and configured to adjust a flow rate of the silicon solution supplied to the temperature control tank 47. The fourth flow rate controller 44C is composed of an opening/closing valve, a flow rate control valve, a flowmeter, and so forth.

The inner tub 45 has an open top, and the etching liquid is supplied to near the top thereof. In the inner tub 45, the lot (the multiplicity of substrates 8) is immersed in the etching liquid by the substrate elevating device 29, so that the etching processing is performed on the substrates 8. The inner tub 45 constitutes a substrate processing tub.

The outer tub 46 is provided around an upper portion of the inner tub 45 and has an open top. The etching liquid overflown from the inner tub 45 is introduced into the outer tub 46. Further, a solution in which the silicon solution is dissolved in the phosphoric acid aqueous solution is supplied into the outer tub 46 from the temperature control tank 47. Further, the pure water is supplied into the outer tub 46 from the pure water supply unit 42. Furthermore, the $SiO_2$ precipitation inhibitor is also supplied into the outer tub 46 from the $SiO_2$ precipitation inhibitor supply unit 43. The $SiO_2$ precipitation inhibitor supplied into the outer tub 46 is mixed into the etching liquid within the outer tub 46. That is, the $SiO_2$ precipitation inhibitor is mixed into the phosphoric acid aqueous solution in the outer tub 46.

The outer tub 46 and the inner tub 45 are connected by a first circulation line 50. One end of the first circulation line 50 is connected to the outer tub 46, and the other end of the first circulation line 50 is connected to a processing liquid supply nozzle 49 provided within the inner tub 45.

The first circulation line 50 is provided with a first pump 51, a first heater 52 and a filter 53 in sequence from the outer tub 46 side. The etching liquid within the outer tub 46 is introduced into the inner tub 45 from the processing liquid supply nozzle 49 after a temperature thereof is increased by the first heater 52. The first heater 52 heats the etching liquid to be supplied into the inner tub 45 to a first preset temperature suitable for the etching processing.

By driving the first pump 51, the etching liquid is fed into the inner tub 45 from the outer tub 46 through the first circulation line 50. Further, the etching liquid is flown back into the outer tub 46 by being overflown from the inner tub 45. In this way, a circulation path 55 of the etching liquid is formed. That is, the circulation path 55 is formed by the outer tub 46, the first circulation line 50 and the inner tub 45. In the circulation path 55, the inner tub 45, the outer tub 46 and the first heater 52 are provided in sequence from an upstream side of the circulation path 55.

In the temperature control tank 47, the silicon solution supplied from the silicon supply unit 44 is mixed into a phosphoric acid aqueous solution (new liquid) which is different from the phosphoric acid aqueous solution supplied into the inner tub 45 and the outer tub 46. That is, in the temperature control tank 47, the silicon solution is mixed into the phosphoric acid aqueous solution which is not the phosphoric acid aqueous solution present in the circulation path 55. Accordingly, a solution (mixed liquid) in which the silicon solution is dissolved in the phosphoric acid aqueous solution is produced to be stored in the temperature control tank 47. Connected to the temperature control tank 47 is a second circulation line 60 configured to circulate the solution within the temperature control tank 47. Further, one end of a supply line 70 is connected to the temperature control tank 47. The other end of the supply line 70 is connected to the outer tub 46. Further, the phosphoric acid aqueous solution may be supplied by another device other than the phosphoric acid aqueous solution supply unit 40. The temperature control tank 47 constitutes a mixing unit. The second circulation line 60 constitutes a circulation line.

The second circulation line 60 is provided with a second pump 61 and a second heater 62. By driving the second pump 61 with the second heater 62 turned ON, the solution within the temperature control tank 47 is circulated while being heated. As this solution is circulated through the second circulation line 60, dissolution of the silicon solution into the phosphoric acid aqueous solution is accelerated, so that a concentration of the silicon-containing compound in the solution is uniformed.

Further, a supply amount of the silicon solution is adjusted such that the concentration of the silicon-containing compound in the solution reaches a preset concentration.

The second heater 62 heats the solution to a second preset temperature. The second preset temperature may be equal to or different from the first preset temperature. By way of example, if the second preset temperature is set to be higher than the first preset temperature, a greater amount of silicon-containing compound is dissolved in the solution, as compared to a case where the solution is set to have the first preset temperature. Therefore, the silicon concentration of the solution can be further increased.

The supply line 70 is provided with a third pump 71 and a fifth flow rate controller 72. The fifth flow rate controller 72 is configured to adjust a supply amount of the solution supplied into the outer tub 46. The fifth flow rate controller 72 is composed of an opening/closing valve, a flow rate control valve, a flowmeter, and so forth.

The solution stored in the temperature control tank 47 is supplied into the outer tub 46 through the supply line 70 when replacing the whole or a part of the etching liquid. When the solution is supplied into the outer tub 46, the supply amount thereof is adjusted such that the silicon concentration in the etching liquid reaches a preset silicon concentration. To elaborate, the supply amount of the solution is adjusted based on an elapsed time of the etching processing which is set through a previous experiment or the like.

The solution is a liquid in which the silicon-containing compound is sufficiently dissolved. Therefore, the solution supplied into the outer tub 46 is mixed into the etching liquid, and the etching liquid becomes a liquid in which the silicon-containing compound is dissolved.

Further, a concentration meter configured to detect the silicon concentration may be provided at the temperature control tank 47, and the supply amount of the solution may be adjusted based on the silicon concentration detected by the concentration meter. That is, the supply amount of the solution may be adjusted based on the detected silicon concentration such that the silicon concentration in the etching liquid within the inner tub 45 reaches the preset silicon concentration.

The phosphoric acid aqueous solution drain unit 41 is configured to drain the etching liquid when replacing the whole or the part of the etching liquid used in the etching processing. The phosphoric acid aqueous solution drain unit 41 includes a drain line 41A, a sixth flow rate controller 41B and a cooling tank 41C.

The drain line 41A is connected to the first circulation line 50. The sixth flow rate controller 41B is provided at the drain line 41A and configured to adjust a drain amount of the etching liquid. The sixth flow rate controller 41B is composed of an opening/closing valve, a flow rate control valve, a flowmeter, and so forth. The cooling tank 41C temporarily stores therein and cools the etching liquid flown through the drain line 41A.

Further, opening/closing operations of the opening/closing valves and opening degrees of the flow rate control valves, which constitute the first to sixth flow rate controllers 40C to 41B, are changed as actuators (not shown) are operated based on signals from the control unit 100. That is, the opening/closing valves and the flow rate control valves constituting the first to sixth flow rate controllers 40C to 41B are controlled by the control unit 100.

Figure 3:
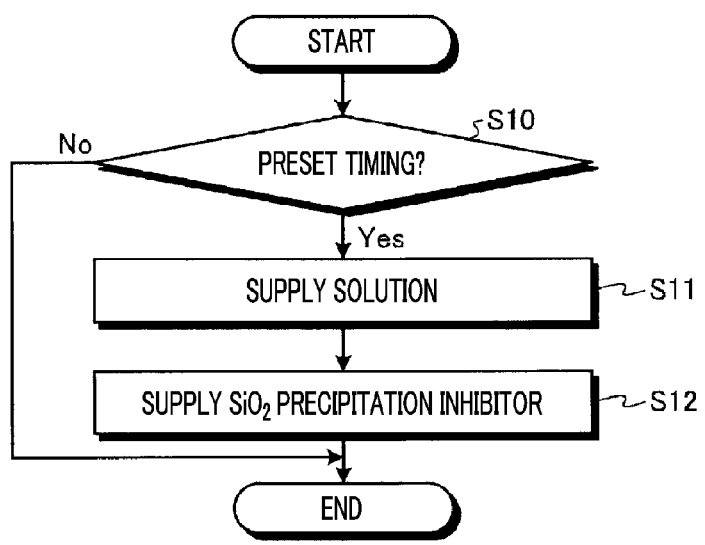
FIG. 3 is a flowchart for describing a method of supplying a solution according to the first exemplary embodiment.

Now, a method of supplying the solution in the substrate processing apparatus 1 according to the first exemplary embodiment will be explained with reference to FIG. 3. FIG. 3 is a flowchart for describing the method for supplying the solution according to the first exemplary embodiment.

The substrate processing apparatus 1 determines whether it is a preset timing (S10). The preset timing is previously set and is a timing when the silicon concentration in the etching liquid becomes smaller than the preset silicon concentration which is previously set. By way of example, the preset timing may be a timing when the whole or a part of the etching liquid is drained. The substrate processing apparatus 1 may determine whether it is the preset timing based on, for example, the elapsed time of the etching processing. Alternatively, the substrate processing apparatus 1 may determine whether it is the preset timing based on the silicon concentration in the etching liquid within the outer tub 46 detected by the concentration meter.

If it is the preset timing (S10: Yes), the substrate processing apparatus 1 supplies the solution from the temperature control tank 47 into the outer tub 46 (S11), and supplies the $SiO_2$ precipitation inhibitor from the $SiO_2$ precipitation inhibitor supply unit 43 into the outer tub 46 (S12). Accordingly, the $SiO_2$ precipitation inhibitor and the solution in which the silicon-containing compound is sufficiently dissolved are supplied into the outer tub 46.

If it is not the preset timing (S10: No), the substrate processing apparatus 1 ends the current processing.

In the substrate processing apparatus 1, the silicon solution is mixed, in the temperature control tank 47, into the phosphoric acid aqueous solution which is different from the phosphoric acid aqueous solution (etching liquid) supplied into the inner tub 45 and the outer tub 46, and, thus, the solution in which the silicon solution is dissolved into the phosphoric acid aqueous solution is generated in the temperature control tank 47. Then, the substrate processing apparatus 1 supplies this generated solution into the outer tub 46. As stated, by supplying into the outer tub 46 the solution in which the silicon solution is dissolved, the substrate processing apparatus 1 is capable of easily dissolving the silicon solution in the etching liquid used in the etching processing. Accordingly, the substrate processing apparatus 1 is capable of shortening the adjustment time for increasing the silicon concentration in the etching liquid, so that the etching processing time can be shortened.

Furthermore, by supplying into the outer tub 46 the solution in which the silicon solution is dissolved, the substrate processing apparatus 1 is capable of suppressing the silicon-containing compound from being accumulated at the filter 53.

Second Exemplary Embodiment

Figure 4:
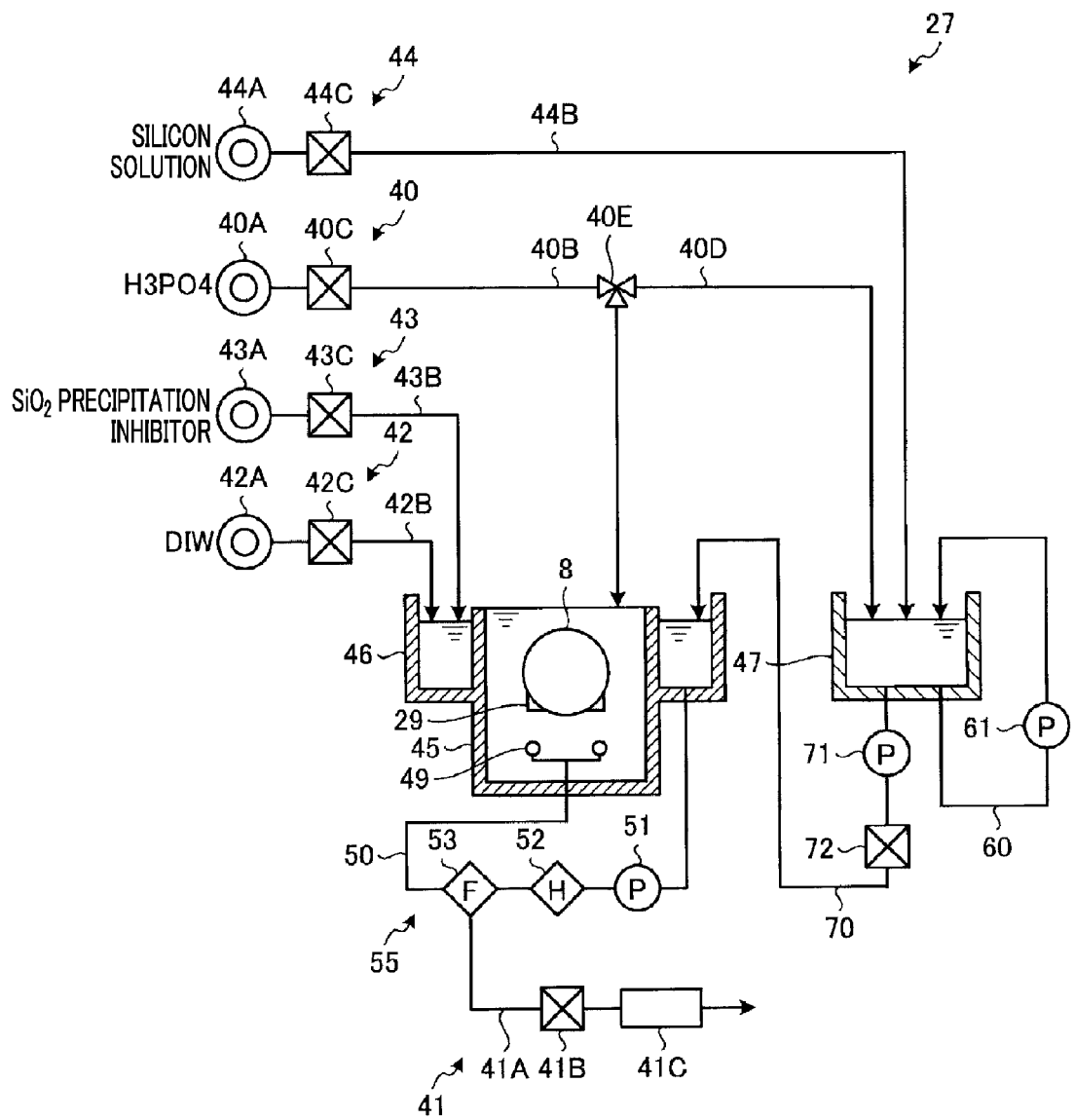
FIG. 4 is a schematic block diagram illustrating a processing tub for etching according to a second exemplary embodiment.

Now, a substrate processing apparatus 1 according to a second exemplary embodiment will be discussed with reference to FIG. 4. FIG. 4 is a schematic block diagram illustrating a processing tub 27 for etching according to the second exemplary embodiment. Here, description will be provided focusing on distinctive parts from those of the first exemplary embodiment, and parts which are the same as those of the first exemplary embodiment will be assigned same reference numerals, and detailed description thereof will be omitted.

The processing tub 27 for etching does not have the second heater 62, as compared to the first exemplary embodiment.

In a temperature control tank 47, a silicon solution (silicon-containing compound) is mixed into a chemical liquid configured to dissolve the silicon solution, and a solution generated as the silicon solution is dissolved in the chemical liquid is stored in the temperature control tank 47. The chemical liquid is one which dissolves the silicon solution at a room temperature. The chemical liquid may be, by way of example, but not limitation, hydrofluoric acid or ammonium hydroxide.

The substrate processing apparatus 1 supplies the solution from the temperature control tank 47 into the outer tub 46, and also supplies the $SiO_2$ precipitation inhibitor into the outer tub 46 at the preset timing, the same as in the first exemplary embodiment.

In the substrate processing apparatus 1 according to the second exemplary embodiment, the silicon solution is mixed, in the temperature control tank 47, into the chemical liquid configured to dissolve the silicon solution at the room temperature, and, thus, the solution in which the silicon solution is dissolved in the chemical liquid is generated in the temperature control tank 47. The generated solution is supplied into the outer tub 46. Accordingly, the substrate processing apparatus 1 is capable of shortening a time for increasing the silicon concentration during the etching processing, so that the etching processing time can be shortened.

Further, in the substrate processing apparatus 1, since the silicon solution is dissolved in the chemical liquid which dissolves the silicon solution at the room temperature, it is possible to generate the solution without using a heater which heats the solution. Therefore, the substrate processing apparatus 1 can be scaled down, and cost can be cut.

Moreover, as in the first exemplary embodiment, the substrate processing apparatus 1 may heat the solution by providing the second heater 62 at the second circulation line 60. With this configuration, a time required for dissolving the silicon solution in the chemical liquid can be shortened.

Third Exemplary Embodiment

Figure 5:
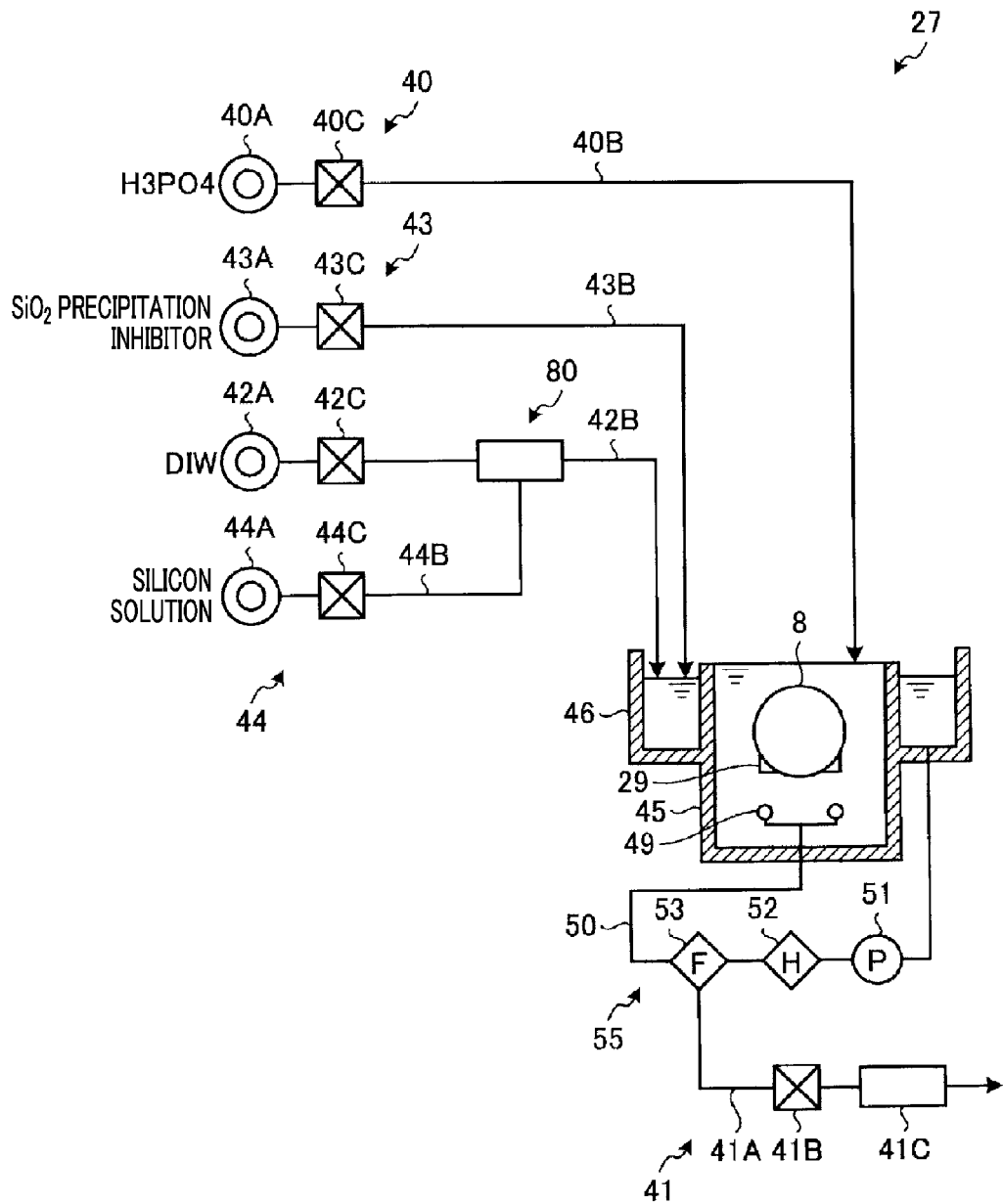
FIG. 5 is a schematic block diagram illustrating a processing tub for etching according to a third exemplary embodiment.

Now, a substrate processing apparatus 1 according to a third exemplary embodiment will be discussed with reference to FIG. 5. FIG. 5 is a schematic block diagram illustrating a processing tub 27 for etching according to the third exemplary embodiment. Here, description will be provided focusing on distinctive parts from those of the first exemplary embodiment, and parts which are the same as those of the first exemplary embodiment will be assigned same reference numerals, and detailed description thereof will be omitted.

The processing tub 27 for etching is not equipped with the temperature control tank 47, as compared to the first exemplary embodiment. Further, the processing tub 27 for etching has a mixer 80. The mixer 80 is connected to the pure water supply line 42B and the silicon supply line 44B.

Figure 6:
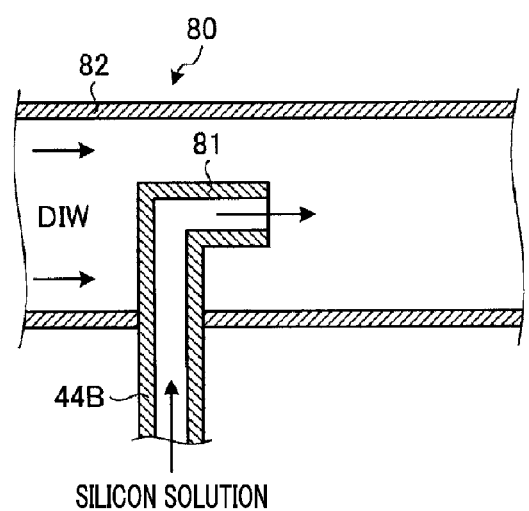
FIG. 6 is a cross sectional view illustrating a schematic configuration of a mixer according to the third exemplary embodiment.

As depicted in FIG. 6, the mixer 80 is implemented by a dual pipe in which one end of an inner pipe 81 is opened within an outer pipe 82. The other end of the inner pipe 81 is connected to the silicon supply line 44B. The outer pipe 82 is connected to the pure water supply line 42B (see FIG. 5). To elaborate, the mixer 80 is inserted in the pure water supply line 42B, and the outer pipe 82 constitutes a part of the pure water supply line 42B. FIG. 6 is a cross sectional view illustrating a schematic configuration of the mixer 80 according to the third exemplary embodiment. The mixer 80 is configured to mix the silicon solution, which is flown out from the inner pipe 81, into DIW flowing in the outer pipe 82. That is, a mixed solution, in which the silicon solution is mixed into the DIW serving as a liquid different from the phosphoric acid aqueous solution (etching liquid) supplied into the inner tub 45 and the outer tub 46, is generated. The mixer 80 constitutes a mixing unit. The pure water supply line 42B constitutes a supply line.

The inner pipe 81 is formed to have, for example, a spiral shape to allow the silicon solution flown out from the inner pipe 81 to be uniformly mixed into the DIW flowing in the outer pipe 82. The mixer 80 mixes the silicon solution into the DIW by generating a turbulence in the silicon solution flown out from the inner pipe 81. The DIW in which the silicon solution is mixed by the mixer 80 is then supplied into an outer tub 46.

Further, the mixer 80 may mix the silicon solution into the DIW by generating the turbulence in various ways. By way of non-limiting example, prominences and depressions may be provided on an inner wall of the outer pipe 82, and prominences and depressions may be provided on an inner wall or an outer wall of the inner pipe 81. Furthermore, the mixer 80 may be implemented by a static mixer.

In addition, in the mixer 80, the other end of the inner pipe 81 may be connected to the pure water supply line 42B, and the outer pipe 82 may be connected to the silicon supply line 44B.

Furthermore, the substrate processing apparatus 1 according to the third exemplary embodiment may not be provided with the mixer 80. Instead, the pure water supply line 42B and the silicon supply line 44B may be connected to mix the silicon solution into the DIW, and a mixed solution in which the silicon solution is mixed into the DIW may be supplied into the outer tub 46.

As in the first exemplary embodiment, if it is a preset timing, the substrate processing apparatus 1 according to the third exemplary embodiment supplies the mixed solution in which the silicon solution is mixed into the DIW into the outer tub 46 and supplies the $SiO_2$ precipitation inhibitor into the outer tub 46.

In the substrate processing apparatus 1 according to the third exemplary embodiment, by mixing the silicon solution into the DIW, particles of the silicon-containing compound in the silicon solution are dispersed in the DIW. Accordingly, the substrate processing apparatus 1 is capable of suppressing the particles of the silicon-containing compound from being condensed, so that the accumulation of the silicon-containing compound at the filter 53 can be suppressed.

Figure 7:
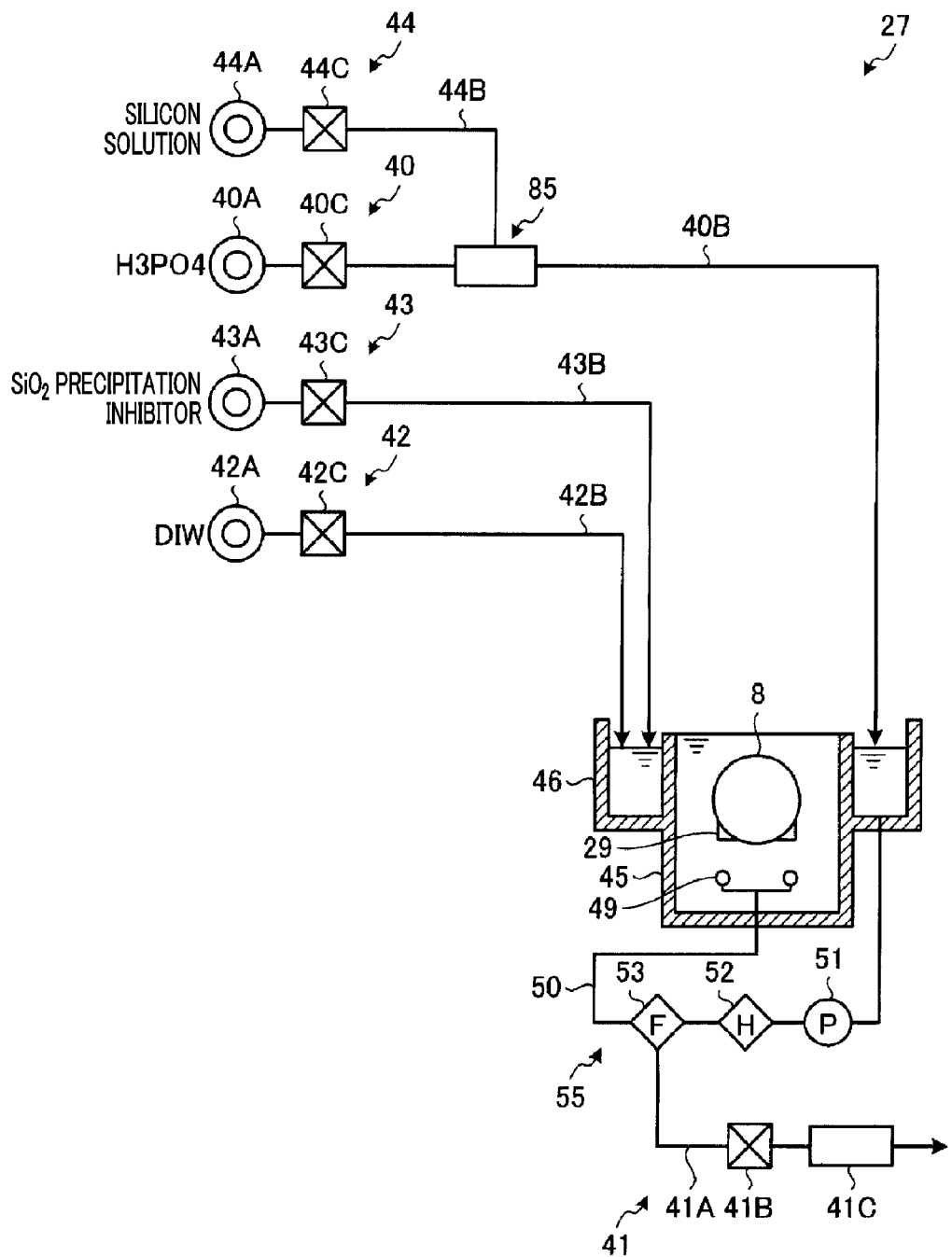
FIG. 7 is a schematic block diagram illustrating a processing tub of a modification example of the substrate processing apparatus according to the third exemplary embodiment.

Further, the substrate processing apparatus 1 may mix the silicon solution and the phosphoric acid aqueous solution, as shown in FIG. 7. FIG. 7 is a schematic block diagram illustrating a processing tub 27 of a modification example of the substrate processing apparatus 1 according to the third exemplary embodiment. By way of example, the substrate processing apparatus 1 connects the mixer 85 to the phosphoric acid aqueous solution supply line 40B and the silicon supply line 44B. Further, the phosphoric acid aqueous solution supply unit 40 supplies the phosphoric acid aqueous solution into the outer tub 46.

Figure 8:
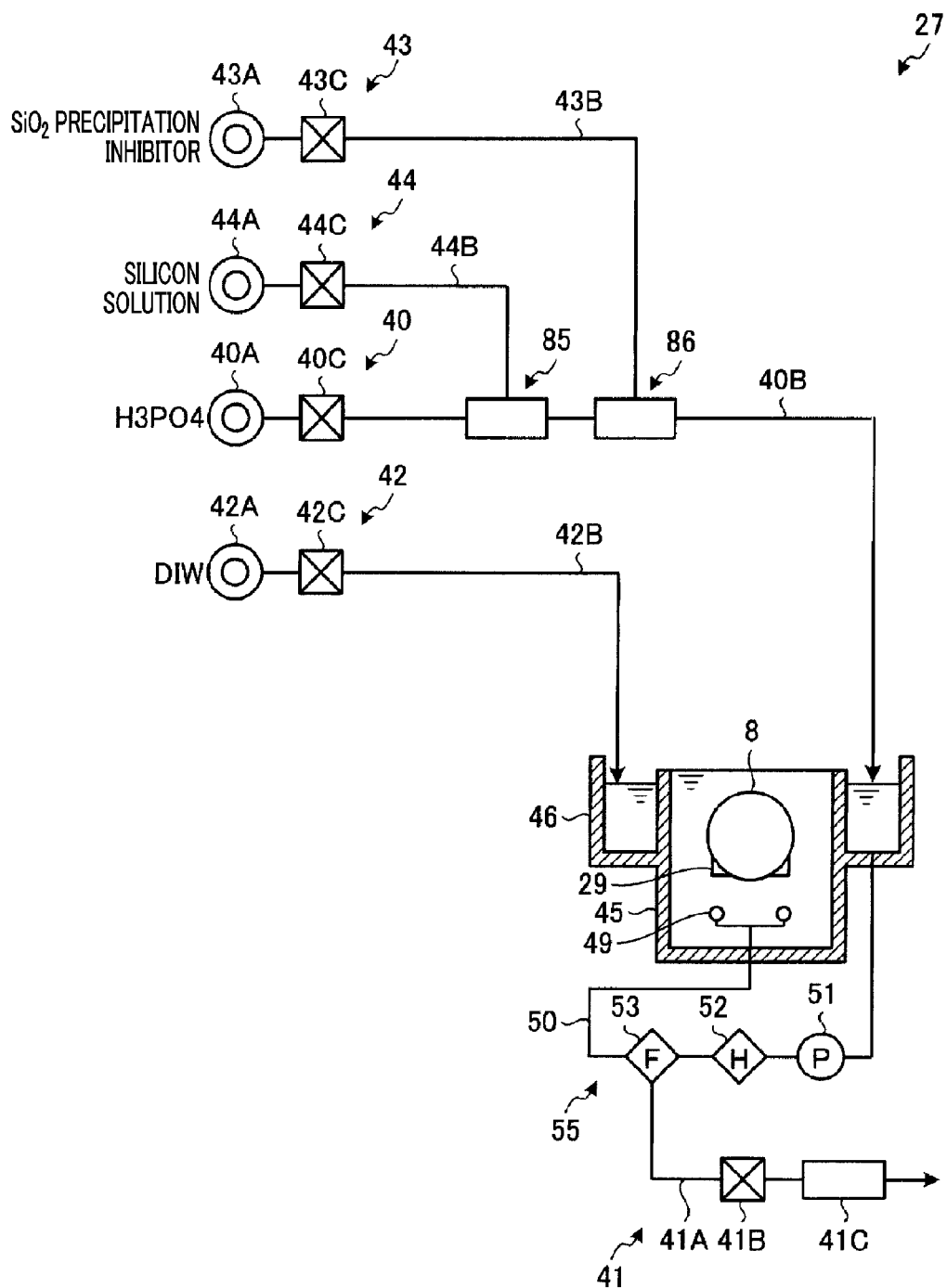
FIG. 8 is a schematic block diagram illustrating a processing tub of a modification example of the substrate processing apparatus according to the third exemplary embodiment.

Further, the substrate processing apparatus 1 may mix the silicon solution, the phosphoric acid aqueous solution and the $SiO_2$ precipitation inhibitor, as shown in FIG. 8. FIG. 8 is a schematic block diagram illustrating a processing tub 27 of a modification example of the substrate processing apparatus 1 according to the third exemplary embodiment. For example, the substrate processing apparatus 1 mixes the silicon solution, the phosphoric acid aqueous solution and the $SiO_2$ precipitation inhibitor by using two mixers 85 and 86. The substrate processing apparatus 1 connects the mixer 85 to the phosphoric acid aqueous solution supply line 40B and the silicon supply line 44B, and connects the mixer 86 to the phosphoric acid aqueous solution supply line 40B and the $SiO_2$ precipitation inhibitor supply line 43B. Further, the phosphoric acid aqueous solution supply unit 40 supplies the phosphoric acid aqueous solution into the outer tub 46.

Fourth Exemplary Embodiment

Figure 9:
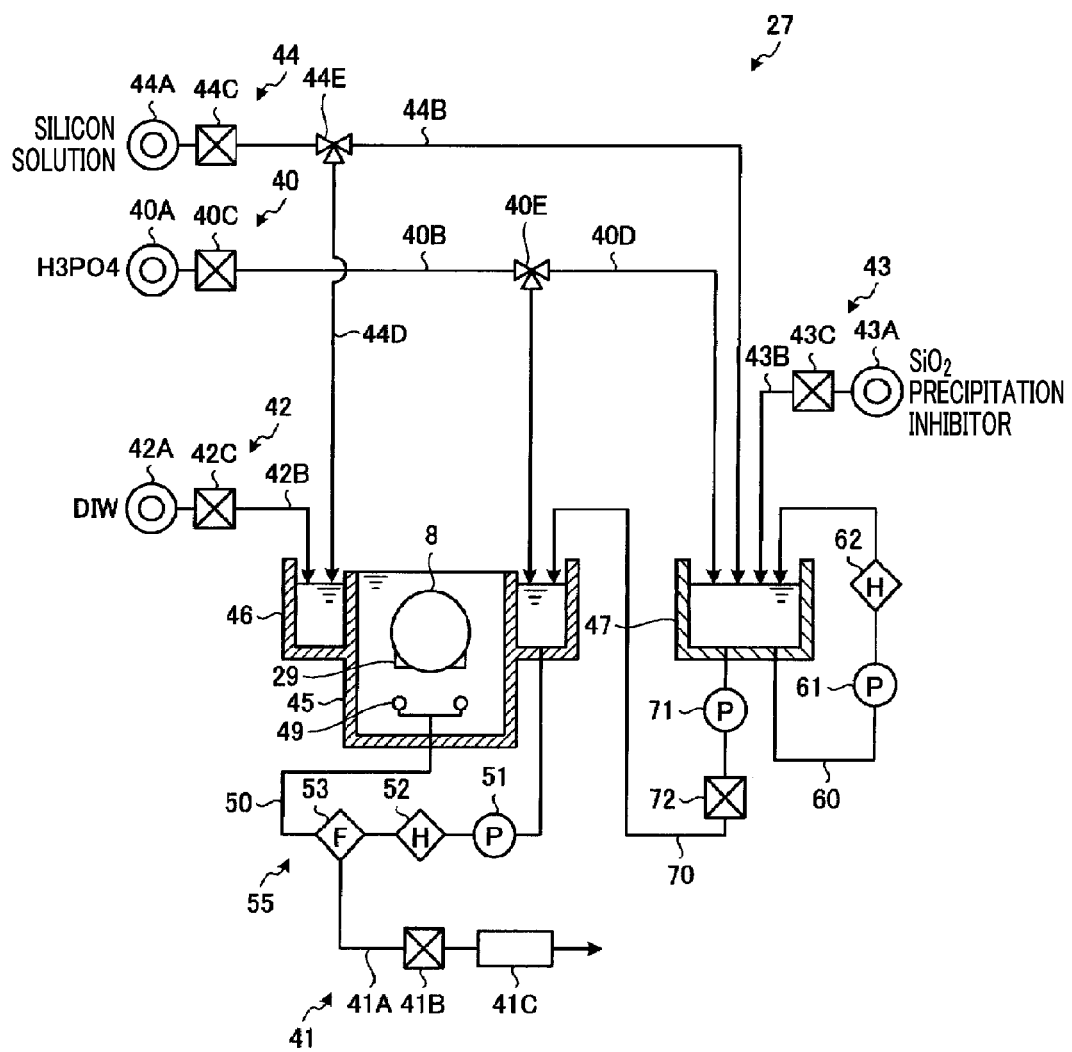
FIG. 9 is a schematic block diagram illustrating a processing tub for etching according to a fourth exemplary embodiment.

Now, a substrate processing apparatus 1 according to a fourth exemplary embodiment will be discussed with reference to FIG. 9. FIG. 9 is a schematic block diagram illustrating a processing tub 27 for etching according to the fourth exemplary embodiment. Here, description will be provided focusing on distinctive parts from those of the first exemplary embodiment, and parts which are the same as those of the first exemplary embodiment will be assigned same reference numerals, and detailed description thereof will be omitted.

The silicon supply unit 44 supplies the silicon solution into the outer tub 46 or the temperature control tank 47. To elaborate, the silicon supply unit 44 is equipped with a branch line 44D branched from the silicon supply line 44B. The silicon source 44A and the outer tub 46 are connected via the branch line 44D, and the silicon solution is supplied from the silicon source 44A into the outer tub 46.

The branch line 44D is connected to the silicon supply line 44B via, by way of non-limiting example, a three-way valve 44E. The three-way valve 44E switches a supply destination of the silicon solution to either the temperature control tank 47 or the outer tub 46.

The phosphoric acid aqueous solution supply unit 40 supplies the phosphoric acid aqueous solution into the outer tub 46 through the phosphoric acid aqueous solution supply line 40B.

The SiO2 precipitation inhibitor supply unit 43 supplies the SiO2 precipitation inhibitor into the temperature control tank 47 through the SiO2 precipitation inhibitor supply line 43B. Further, the SiO2 precipitation inhibitor supply unit 43 may supply the SiO2 precipitation inhibitor into the outer tub 46, the same as in the first exemplary embodiment.

In the temperature control tank 47, a solution (mixed solution) in which the phosphoric acid aqueous solution, the silicon solution and the $SiO_2$ precipitation inhibitor are mixed is produced to be stored. The solution within the temperature control tank 47 is circulated through the second circulation line 60 and heated to a second preset temperature. Further, a silicon concentration of the solution is adjusted to an initial concentration. The initial concentration is previously set and is lower than the preset silicon concentration.

Figure 10:
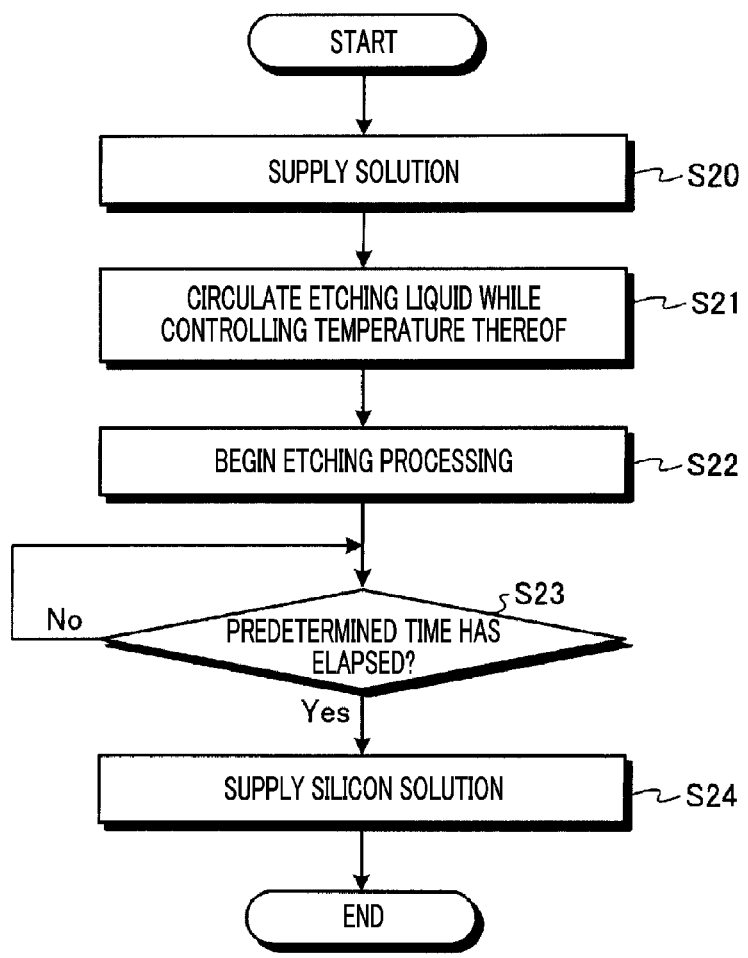
FIG. 10 is a flowchart for describing a method of supplying a silicon solution according to the fourth exemplary embodiment.

Now, a method of supplying the silicon solution in the substrate processing apparatus 1 according to the fourth exemplary embodiment will be explained with reference to FIG. 10. FIG. 10 is a flowchart for describing the method of supplying the silicon solution according to the fourth exemplary embodiment. For example, the method of supplying the silicon solution according to the fourth exemplary embodiment may be performed when carrying out the etching processing after replacing the whole etching liquid.

The substrate processing apparatus 1 supplies the solution stored in the temperature control tank 47 into the outer tub 46 and the inner tub 45 from which the etching liquid used in the etching processing is drained (S20). To elaborate, the substrate processing apparatus 1 supplies the solution into the outer tub 46, and supplies the solution into the inner tub 45 through the first circulation line 50. The solution supplied into the inner tub 45 and the outer tub 46 are used as the etching liquid in performing the etching processing.

The substrate processing apparatus 1 circulates the etching liquid in the circulation path 55 while controlling the temperature thereof (S21). To elaborate, the substrate processing apparatus 1 circulates the etching liquid by driving the first pump 51 and heats the etching liquid to the first preset temperature by the first heater 52.

The substrate processing apparatus 1 begins the etching processing by immersing a lot (a multiplicity of substrates 8) in the inner tub 45 (S22). The etching liquid has the silicon concentration set to the initial concentration, that is, lower than the preset concentration. Immediately after the etching processing is begun, a dissolved amount of the silicon into the etching liquid from the substrates 8 is increased temporarily. As a result, the silicon oxide ($SiO_2$) is temporarily precipitated, resulting in a local increase of the silicon concentration. For the reason, the substrate processing apparatus 1 begins the etching processing with the etching liquid having the silicon concentration set to the initial concentration. Here, the initial concentration may be set depending on processing conditions. The initial concentration may be set to 0 ppm.

Upon a lapse of a predetermined time after the beginning of the etching processing (S23: Yes), the substrate processing apparatus 1 supplies the silicon solution into the outer tub 46 from the silicon supply unit 44 (S24). The predetermined time is a time taken until a period during which the silicon concentration is locally increased elapses and is previously set by an experiment or the like. That is, the substrate processing apparatus 1 supplies the silicon solution into the outer tub 46 from the silicon supply unit 44 after the predetermined time elapses from the beginning of the etching processing, and sets the silicon concentration after the lapse of the predetermined time to be higher than the silicon concentration before the lapse of the predetermined time.

The substrate processing apparatus 1 supplies the silicon solution such that the silicon concentration of the etching liquid reaches the preset silicon concentration. For example, the substrate processing apparatus 1 supplies the silicon solution based on an elapsed time of the etching processing previously set by an experiment or the like. Further, the substrate processing apparatus 1 detects the silicon concentration in the etching liquid by a concentration meter or the like and supplies the silicon solution based on the detected silicon concentration.

Furthermore, until the predetermined time elapses after the beginning of the etching processing (S23: No), the substrate processing apparatus 1 performs the etching processing without supplying the silicon solution.

The substrate processing apparatus 1 is equipped with the silicon supply unit 44 configured to supply the silicon solution into the outer tub 46. With this configuration, the substrate processing apparatus 1 is capable of changing the silicon concentration of the etching liquid during the etching processing. Therefore, the substrate processing apparatus 1 is capable of setting the silicon concentration of the etching liquid to an appropriate concentration for the etching processing, so that the etching processing can be performed with high accuracy.

Further, by supplying the silicon solution into the outer tub 46 from the silicon supply unit 44 after the etching processing is begun, the substrate processing apparatus 1 sets the silicon concentration of the etching liquid to be higher than the silicon concentration at the beginning of the etching processing. To be specific, the substrate processing apparatus 1 supplies the silicon solution into the outer tub 46 after a lapse of the predetermined time from the beginning of the etching processing.

Accordingly, the substrate processing apparatus 1 is capable of suppressing an excessive increase of the silicon concentration of the etching liquid caused by the silicon dissolved in the etching liquid from the substrates 8 after the etching processing is begun. Therefore, the substrate processing apparatus 1 is capable of suppressing the precipitation of the silicon oxide on the oxide film.

Furthermore, by supplying the silicon solution into the outer tub 46 upon the lapse of the predetermined time from the beginning of the etching processing, the substrate processing apparatus 1 is capable of improving the selectivity for etching only the nitride film.

Moreover, in case of etching a substrate 8 on which the nitride film and the oxide film are alternately stacked in multiple layers and a groove through which the etching liquid is introduced to etch the nitride film is formed, the substrate processing apparatus 1 is capable of etching a part of the oxide film in the vicinity of the groove. To elaborate, the substrate processing apparatus 1 is capable of etching an end portion of the oxide film. Accordingly, the substrate processing apparatus 1 is capable of increasing a distance between silicon oxide films in the vicinity of the groove. Therefore, the replacement of the etching liquid between the silicon oxide films can be performed easily. Thus, the substrate processing apparatus 1 is capable of progressing the etching on the nitride film, so that the etching processing time can be shortened.

In addition, in the substrate processing apparatus 1, the silicon solution is supplied from the silicon supply unit 44 into the outer tub 46. However, the exemplary embodiment is not limited thereto. By way of example, the substrate processing apparatus 1 may further include a tank configured to mix the silicon solution and the phosphoric acid aqueous solution therein, and a liquid (mixed solution) in which the silicon solution and the phosphoric acid aqueous solution are mixed may be supplied into the outer tub 46 from the tank. Further, the substrate processing apparatus 1 may set the silicon concentration of the liquid mixed in the tank to be high. To be specific, the substrate processing apparatus 1 increases the silicon concentration of the liquid mixed in the tank by changing a mixing ratio between the silicon solution and the phosphoric acid aqueous solution. Then, the substrate processing apparatus 1 may supply the liquid with the increased silicon concentration into the outer tub 46 from the tank after the etching processing is begun. That is, the substrate processing apparatus 1 performs the etching processing by supplying the mixed solution into the outer tub 46 from the tank while increasing the silicon concentration of the mixed solution in the tank. With this configuration as well, the substrate processing apparatus 1 is capable of achieving the same effects as obtained in the above-described exemplary embodiments.

Further, the substrate processing apparatus 1 may not supply the silicon solution into the temperature control tank 47 but generate, in the temperature control tank 47, the solution (mixed solution) in which the phosphoric acid aqueous solution and the $SiO_2$ precipitation inhibitor are mixed. That is, the substrate processing apparatus 1 may begin the etching processing with the etching liquid in which the silicon-containing compound is not contained.

In addition, the substrate processing apparatus 1 may perform the etching processing by supplying the silicon solution into the outer tub 46 from immediately after the beginning of the etching processing to set the silicon concentration of the etching liquid to be high. That is, the substrate processing apparatus 1 performs the etching processing while setting the silicon concentration to be higher than the silicon concentration of the etching liquid at the beginning of the etching processing by supplying the silicon solution into the outer tub 46 after the beginning of the etching processing.

Modification Example

In the substrate processing apparatus 1 according to a modification example, an agitator configured to agitate the solution within the temperature control tank 47 may be provided in the temperature control tank 47. Further, the substrate processing apparatus 1 according to the modification example may allow the silicon-containing compound of a powder shape to be sunk into a bottom portion of the temperature control tank 47. In this configuration, an agitated liquid in an upper portion thereof may be supplied into the outer tub 46.

The substrate processing apparatus 1 according to the modification example may set the timing for supplying the mixed solution (dissolved solution) mixed with the silicon solution into the outer tub 46 and the timing for supplying the SiO$_2$ precipitation inhibitor to be different from each other.

The substrate processing apparatus 1 according to the modification example may connect the supply line 70 to the second circulation line 60 to allow the mixed solution to be supplied from the second circulation line 60 into the outer tub 46 via the supply line 70. In this case, the mixed solution can be supplied into the outer tub 46 without providing the third pump 71 at the supply line 70

Although the above-described substrate processing apparatus 1 is configured to process the multiplicity of substrates 8 at the same time, the substrate processing apparatus 1 may be configured as a single-wafer type processing apparatus configured to process the substrates 8 one by one.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
    a substrate processing tub configured to store therein a processing liquid for performing an etching processing by immersing the substrates in the substrate processing tub;
    a first circulation line configured to circulate the processing liquid in the substrate processing tub;
    a mixing unit including a mixing tank configured to store therein a mixed solution which is produced by mixing a phosphoric acid aqueous solution and a silicon-containing compound or a liquid containing the silicon-containing compound;
    a second circulation line configured to circulate the mixed solution in the mixing tank;
    a supply line connecting the mixing unit with the substrate processing tub, the supply line configured to supply the mixed solution mixed by the mixing unit into the substrate processing tub;
    a silicon supply unit configured to supply the liquid containing the silicon-containing compound into either the mixing tank through a silicon supply line or into an outer tub of the substrate processing tub through a branch line branched from the silicon supply line via a three-way valve; and
    a control unit configured to control the silicon supply unit to supply the liquid containing the silicon-containing compound into the substrate processing tub after the etching processing is begun,
    wherein one end of the first circulation line is connected to the outer tub of the substrate processing tub while another end of the first circulation line is connected to an inner tub of the substrate processing tub, and the first circulation line includes a pump, a heater and a filter that is directly connected to a drain line with a flow controller, wherein the drain line is branched off from the filter, and
    the processing liquid is fed into the inner tub from the outer tub through the first circulation line via the pump, the heater and the filter, and
    wherein the silicon supply line connects a silicon source to the mixing tank,
    the branch line connects the silicon supply line to the outer tub of the substrate processing tub, and
    the control unit is configured to switch the three-way valve to supply the liquid containing the silicon-containing compound into a selected one of the mixing tank and the outer tub of the substrate processing tub.

2. The substrate processing apparatus of claim 1, wherein the mixing unit is configured to mix the liquid containing the silicon-containing compound and a solvent configured to dissolve the liquid containing the silicon-containing compound at a room temperature.

3. The substrate processing apparatus of claim 1, wherein the mixing unit is configured to mix pure water and the liquid containing the silicon-containing compound.

4. The substrate processing apparatus of claim 1, wherein the mixing unit is configured to adjust a temperature of the mixed solution to be different from a temperature of the processing liquid.

5. The substrate processing apparatus of claim 1, wherein the substrate processing apparatus is configured to process a multiplicity of substrates at the same time.

* * * * *